(12) United States Patent
Takei et al.

(10) Patent No.: US 6,500,687 B2
(45) Date of Patent: *Dec. 31, 2002

(54) DISTRIBUTED FEEDBACK SEMICONDUCTOR LASER ELEMENT AND METHOD FOR MAKING THE SAME

(75) Inventors: Kiyoshi Takei, Tsurugashima (JP); Yoshiaki Watanabe, Tsurugashima (JP); Nong Chen, Tsurugashima (JP); Kiyofumi Chikuma, Asaka (JP)

(73) Assignee: Pioneer Electronic Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/049,470

(22) Filed: Mar. 27, 1998

(65) Prior Publication Data

US 2001/0039069 A1 Nov. 8, 2001

(30) Foreign Application Priority Data

Mar. 28, 1997 (JP) .............................. 9-094742

(51) Int. Cl.$^7$ ................................. H01S 5/30
(52) U.S. Cl. ........................ 438/39; 438/32; 438/47; 372/96
(58) Field of Search ........................ 372/96, 45, 46; 438/32, 39, FOR 289, 700, 46, 47

(56) References Cited

U.S. PATENT DOCUMENTS 5,982,804 A * 11/1999 Chen et al. .................... 372/96
6,291,256 B1 * 9/2001 Chen et al. .................... 438/32

* cited by examiner

*Primary Examiner*—Mary Wilczewski
(74) *Attorney, Agent, or Firm*—Morgan, Lewis & Bockius LLP

(57) ABSTRACT

A method for producing a distributed feedback semiconductor laser element includes the steps of forming a laser substrate, forming a ridge by etching the laser substrate, and forming a flattening layer on the ridge. A grating is then formed on the flattening layer and the grating is further transferred to the laser substrate on which the ridge is formed. The flattening layer is removed and electrodes are then formed.

9 Claims, 5 Drawing Sheets

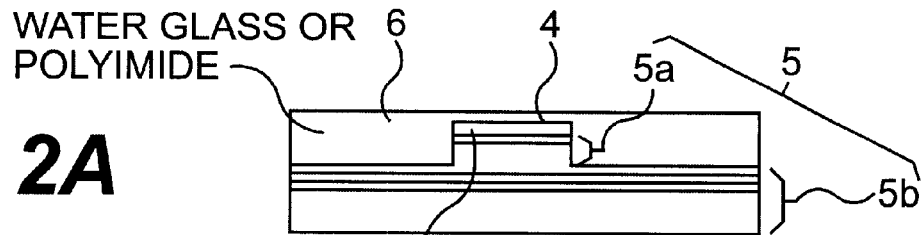
FIG. 2A
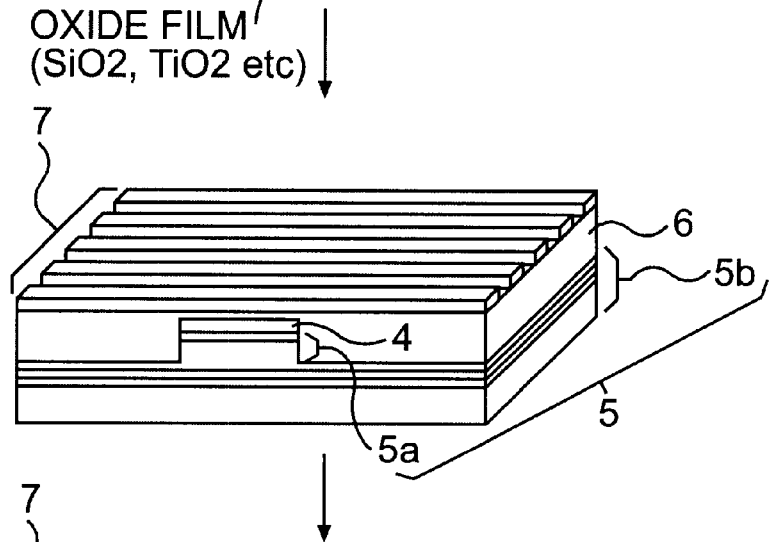
FIG. 2B
FIG. 2C
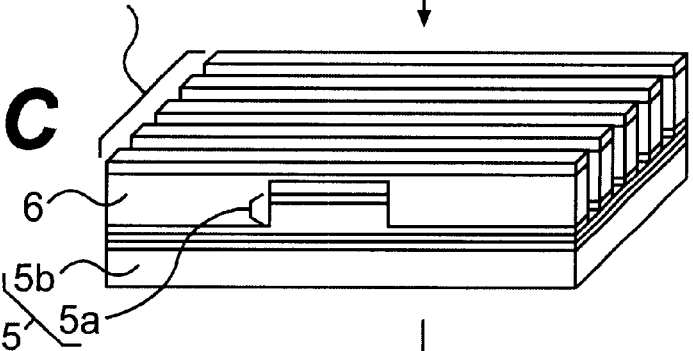
FIG. 2D
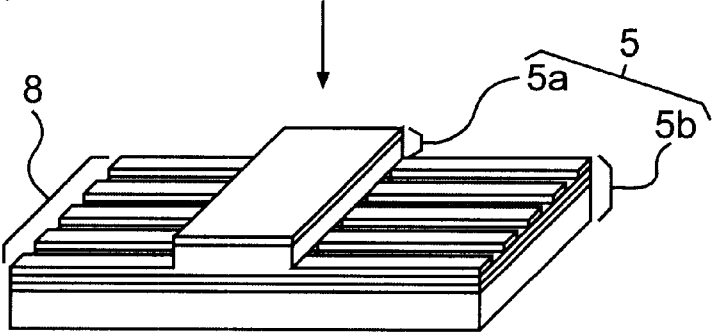
FIG. 2E
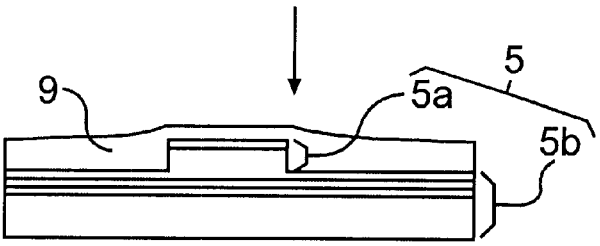

DISTRIBUTED FEEDBACK SEMICONDUCTOR LASER ELEMENT AND METHOD FOR MAKING THE SAME

This application claims the benefit of Application No. 09-94742, filed in Japan on Mar. 28, 1997, which is hereby incorporated by reference.

BACKGROUND OF THE INVENTION

1. Field of the Invention

This invention relates to a production method of a distributed feedback (DFB) semiconductor laser element and a distributed feedback semiconductor laser produced thereby.

2. Description of the Prior Art

The distributed feedback semiconductor laser has been conveniently used in an optical communication system, such as an optical CATV, as a short-wave laser, which uses a second harmonic generation (SHG) element, a pump light source for a small solid laser, an optical measurement field, and similar applications. The conventional distributed feedback semiconductor laser element is formed by a so-called 2-stage epitaxial growth. For the 2-stage epitaxial growth, grating is provided on a waveguide layer of a laser element, then other layers are formed on the waveguide path by epitaxial growth.

FIGS. 4A–4D and 5A–5C illustrate production processes for the conventional distributed feedback semiconductor laser element. FIGS. 5A–5C illustrate post processes of FIGS. 4A–D. In FIG. 4A, on an InP substrate 301, n-InP lower cladding layer 302 and grating supplying layer 303a are formed by a first crystal growth by a predetermined epitaxial growth method, such as a liquid-phase growth method, an organic metal vapor-phase growth method, a molecular beam growth method, or similar process.

As shown in FIG. 4B, the grating layer 303a from FIG. 4A is then exposed by beam interference, so that a grating layer 303b is formed in a grating forming process. As shown in FIG. 4C, an active layer 304, in which the formed grating is buried, a p-InP upper cladding layer 305 and a contact layer 306 are then formed by a second crystal growth, i.e., a regrowth process, on the grating layer 303b.

As shown in FIG. 4D, a ridge-forming mask (not shown) is formed on the contact layer 306. The contact layer 306 and cladding layer 305 are then etched so that ridge 307, having flat side portions 306 and a flat top face protruding therefrom at a predetermined height, is formed.

As shown in FIG. 5A, after the processes depicted in FIGS. 4A–4D are completed, an insulation film 309, such as a spin on glass (SOG) film, a polyimide film or the like is formed over the flat side portions 308 and the flat top face of the ridge 307.

As shown in FIG. 5B, the insulation film 309, on the contact layer 306, is then removed by etching until the contact layer 306 is reached. As shown in FIG. 5C, a metal conductive layer made of Au/Zn or the like is then formed by vacuum deposition or a similar method as electrode 310, so that a ridge stripe type DFB semiconductor laser element is formed. An electrode is also formed on the substrate 301 opposing the electrode 310.

To reduce the complexity required in producing a 2-stage epitaxial growth a so-called non-regrowth distributed feedback semiconductor laser element has been developed. Such laser element is formed on a flat substrate by a 1-stage epitaxial growth method and does not undergo a re-epitaxial growth.

For example, distributed feedback semiconductor laser elements having only a refractive index coupling have been developed, in which the active layer, cladding layer, or similar layer are formed on a substrate by epitaxial growth so as to form a ridge portion. A grating is provided on the top face and flat side portions of the ridge portion.

In the production method of the non-regrowth distributed feedback semiconductor laser element the grating is formed by an electron beam drawing method, a synchrotron radiating X-ray (SOR-X-ray) drawing method, or similar method.

However, in the production method of the aforementioned conventional distributed feedback semiconductor laser element, after grating is formed each stripe-shaped grating must be formed separately by one of the drawing methods. Thus, the amount of time to produce the grating, and hence the laser element, is increased. Furthermore the production apparatus is expensive, thereby increasing production costs.

The non-regrowth method suffers from an additional problem in that the beam interference exposure method (2-beam interference) cannot form the grating uniformly near a ridge because of beam diffraction.

SUMMARY OF THE INVENTION

Accordingly, the present invention is directed to a distributed feedback semiconductor laser element and a method for producing the same that substantially obviates one or more of the problems due to limitations and disadvantages of the related art.

The present invention has been proposed to solve the problems enumerated above, and it therefore is an object of the invention to provide a production method of a distributed feedback semiconductor laser element which can be produced easily and simply.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method for producing a distributed feedback semiconductor laser element includes the steps of forming a laser substrate, forming a ridge by etching the laser substrate, forming a flattening layer on the ridge, forming a grating on the flattening layer, transferring the grating to the laser substrate on which the ridge is formed, removing the flattening layer, and forming electrodes.

In another aspect, the distributed feedback semiconductor laser element includes a laser substrate, wherein a ridge is formed by etching the laser substrate, a flattening layer, which is formed on the ridge of the laser substrate, a grating, which is formed on the flattening layer and wherein the grating is transferred to the laser substrate on which the ridge is formed and the flattening layer is removed, and electrodes.

It is to be understood that both the foregoing general description and the following detailed description are exemplary and explanatory and are intended to provide further explanation of the invention as claimed.

BRIEF DESCRIPTION OF IKE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 2A–2E are diagrams showing additional steps of the production method of the distributed feedback semiconductor laser element according to the preferred embodiment of the present invention;

DETAILED DESCRIPTION OF THE PREFERRED EMBODIMENTS

Reference will now be made in detail to the preferred embodiments of the present invention, examples of which are illustrated in the accompanying drawings.

FIGS. 1A–1F through 3A–3E show a production method of a laterally-coupled distributed feedback semiconductor laser element which is one type of a distributed feedback semiconductor laser element. FIGS. 2A–2E show post processes performed on the substrates depicted in FIGS. 1A–1F. FIGS. 3A–3E show post processes performed on the substrates depicted in FIGS. 2A–2E.

Figure 1A:
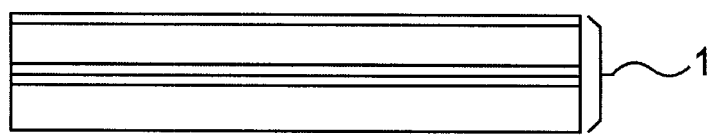
FIGS. 1A–1F are diagrams showing the steps of a production method of a distributed feedback semiconductor laser element, according to a preferred embodiment of the present invention.

As shown in FIG. 1A, a laser substrate 1 includes a lower cladding layer made of n-InP and an active layer made of InGaAsP, which are formed in successive layers on n+-InP substrate using an epitaxial growth method, a liquid-phase growth method, an organic metal vapor-phase growth method, a molecular beam growth method, or similar method, so as to form a separate confinement heterostructure (SCH), a multi quantum well (MQW) structure, a strain MQW structure, or similar type structure.

The active layer is formed so as to be sandwiched by guide layers (upper guide layer, lower guide layer) made of an InGaAsP material having a different composition than the active layer. On the upper guide layer are formed an upper cladding layer made of p-InP, a contact layer, and cap layer made of InGaAsP, successively. The laser substrate is formed by these layers using a first crystal growth.

Figure 1B:
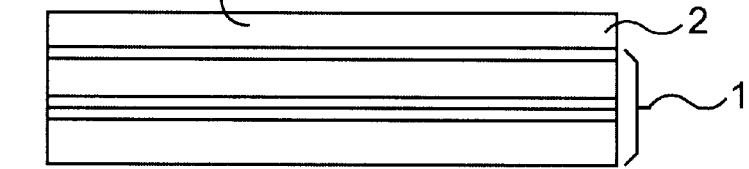

As shown in FIG. 1B, using Sio2, TiO2, or similar compounds, oxide film 2 is then formed on the upper surface of the laser substrate 1 as a mask for formation of a ridge.

Figure 1C:
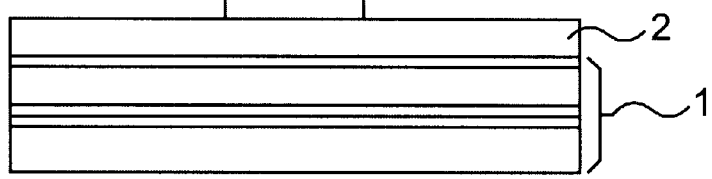

As shown in FIG. 1C, photo-resist is coated on the oxide film 2 forming a stripe pattern having a predetermined width, and then is exposed and developed so as to form a ridge pattern 3.

Figure 1D:
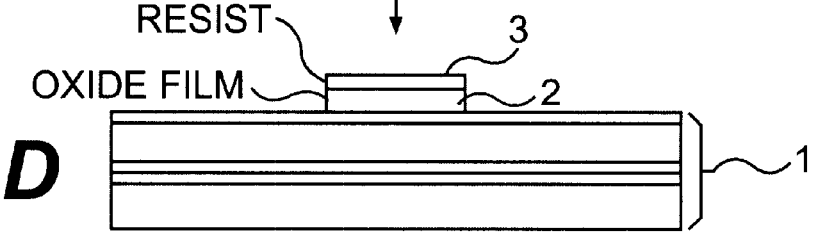

The oxide film 2, on which the ridge pattern 3 is formed, is then dry-etched. As shown in FIG. 1D, the oxide film 2 is removed from the laser substrate 1 except at the portion on which the ridge pattern 3 is formed.

Figure 1E:
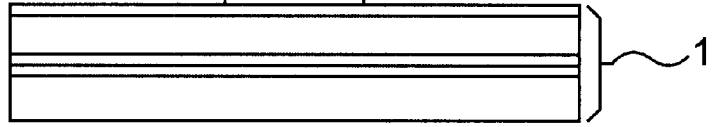

As shown in FIG. 1E, the remaining photo-resist is then removed, and thus the etching mask 4, having a pattern corresponding to the ridge pattern 3 for forming the ridge, is formed on the laser substrate 1.

Figure 1F:
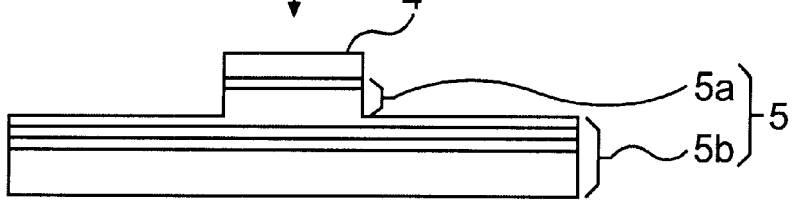

The laser substrate 1 with the etching mask 4 is then dry-etched. As a result of the etching, as shown in FIG. 1F, part of the contact and cap layers made of InGaAsP and the p-InP upper cladding layer are removed from the laser substrate 1 except for the portion corresponding to the etching mask 4. The process forms a ridge 5a having a predetermined height extending under the etching mask 4 corresponding to the ridge pattern 3. On both sides of the ridge 5a is formed a flat semiconductor portion 5b continuous from the ridge 5a.

As shown in FIG. 1F, the ridge 5a is composed of the etching mask 4, part of the contact and cap layers made of InGaAsP, and part of the p-InP upper cladding layer corresponding to the pattern of the etching mask 4. Furthermore, the ridge 5a is formed integrally with the semiconductor portion 5b, which is formed by removing the contact layer and cap layer and the upper cladding layer from the laser substrate 1 so that the surface is substantially flat.

As shown in FIG. 2A, flattening layer 6 is then formed on the ridge 5a and semiconductor portion 5b. The flattening layer 6 is formed so as to submerge the ridge 5a by using a filling such as water glass, polyimide, or a similar material and then hardened so that the surface thereof is substantially flat.

As shown in FIG. 2B, photo-resist is coated on the flattening layer 6, exposed holographically by a two-beam interference method, and developed. As a result, the photo-resist 7, with a grating pattern, is formed.

The flattening layer 6, on which the photo-resist 7 is formed, is then dry-etched. The grating pattern possessed by the photo-resist 7 is transferred to the flattening layer 6 in one step. The flattening layer 6 is dry-etched so that the grating pattern of the flattening layer 6 is transferred to the semiconductor portion 5b in one step, as shown in FIG. 2C.

The etching rate of the oxide film 2 for masking is set so as to be smaller than the etching rate of the flattening layer 6. Thus, when the grating is formed by etching, the etching does not reach the semiconductor (here, the cap layer) below the oxide film 2 for masking of the ridge 5a.

Therefore, when the grating pattern is transferred in the semiconductor portion 5b by the dry etching process, the semiconductor (here, the cap layer) below the oxide film 2 for masking of the ridge 5a, is never etched.

As shown in FIG. 2D, the photo-resist 7, flattening layer 6, and mask 4, which are left after the dry-etching process, are then removed. The result is a grating pattern 8 that is formed on the surface of the semiconductor portion 5b.

The grating pattern is formed on the flattening layer 6 by the 2-beam interference method, and pattern is further transferred to the semiconductor portions 5b formed on both sides of the ridge 5a by the dry-etching process. As a result, the grating pattern is formed securely up to a rising portion of the ridge Sa because influence of beam diffraction by the ridge 5a is not encountered. Therefore, the grating pattern 8 is formed uniformly up to the rising portion of the ridge 5a on the semiconductor portion 5b, as shown in FIG. 2D.

As shown in FIG. 2E, insulation film 9 is then formed on the semiconductor portion 5b on which the ridge 5a and grating 8 are formed. The insulation film 9 is formed so as to submerge the ridge 5a by using a filling such as water glass, polyimide, or similar material and hardened so that the surface thereof is substantially flat.

Figure 3A:
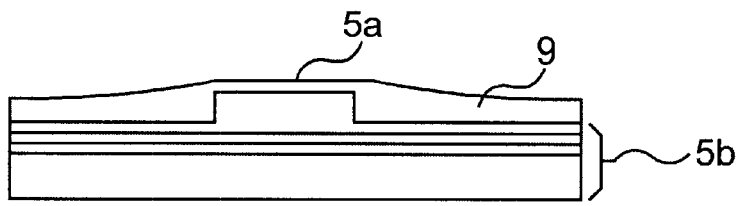
FIGS. 3A–3E are diagrams showing additional steps in the production method of the distributed feedback semiconductor laser element according to the preferred embodiment of the present invention.
Figure 3B:
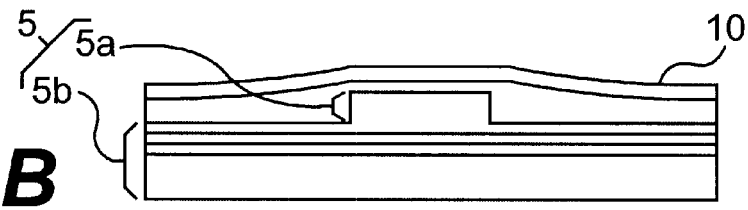

As shown in FIG. 3A, the insulation film 9 is then dry-etched by a self-aligning method so that the top face of the ridge 5a is exposed from the insulation film 9. In FIG.

3B, metal 10 corresponding to a p-electrode is vapor-deposited on the top face of the ridge 5a and the insulation film 9.

Figure 3C:
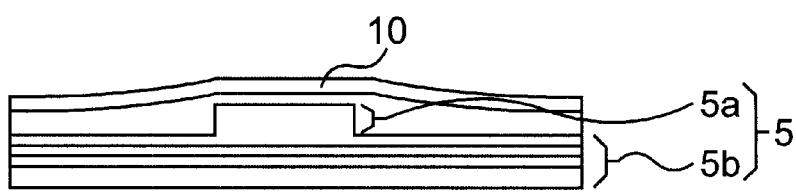
Figure 3D:
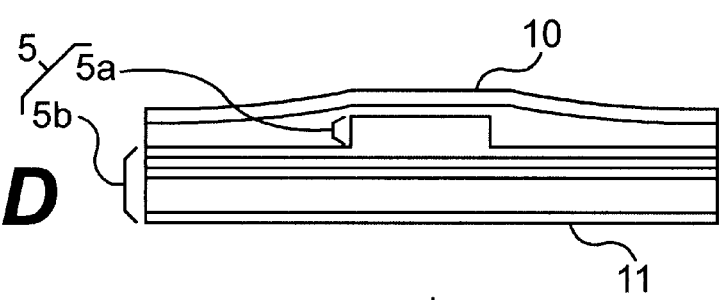

As shown in FIG. 3C, a bottom of the laser substrate 1 (n+-InP substrate) is ground so as to adjust the thickness of the n+-InP substrate to a predetermined thickness. Then, as shown in FIG. 3D, the metal 11 corresponding to a n-electrode is vapor-deposited on the n+-InP substrate, which has been ground down.

Figure 3E:
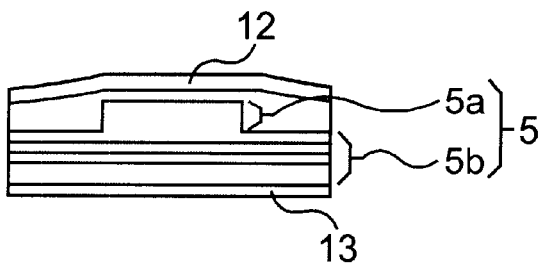
Figure 4A:
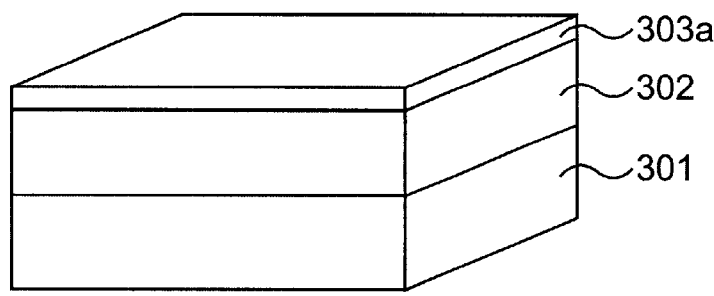
FIGS. 4A–4D are diagrams showing production steps of a conventional distributed feedback semiconductor laser element.
Figure 4B:
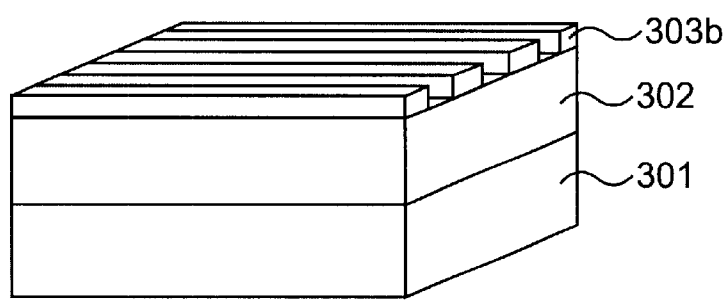
Figure 4C:
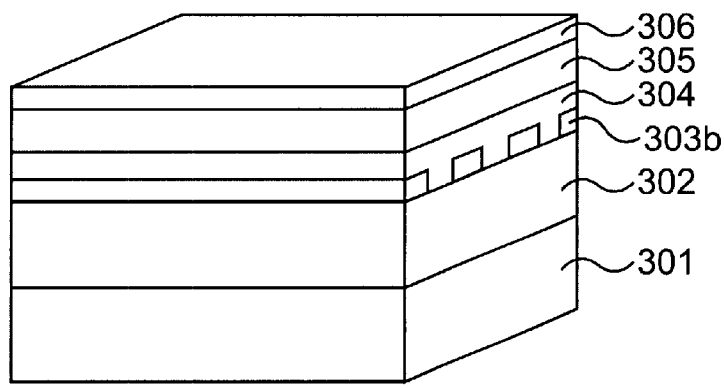
Figure 4D:
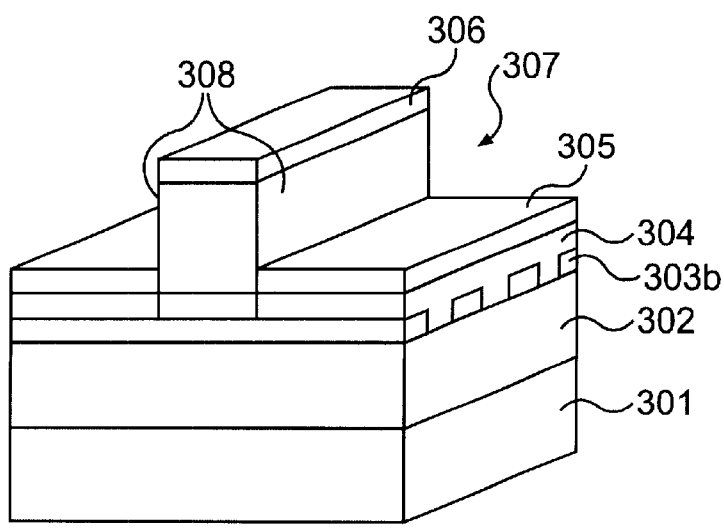
Figure 5A:
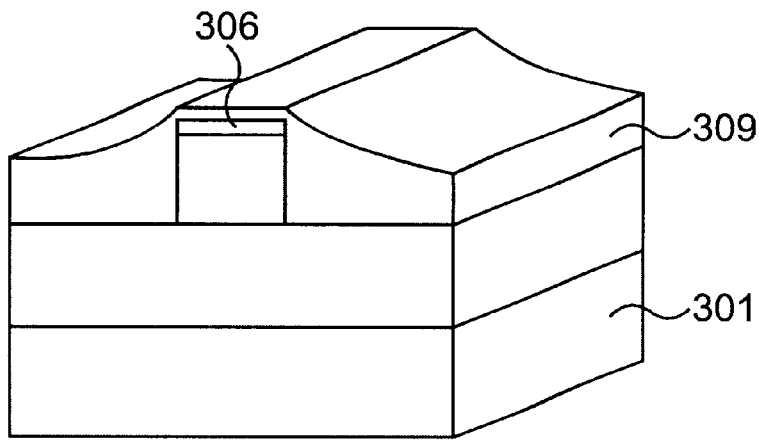
FIGS. 5A–5C are diagrams showing additional production steps of the conventional distributed feedback semiconductor laser element of FIGS. 4A–4D.
Figure 5B:
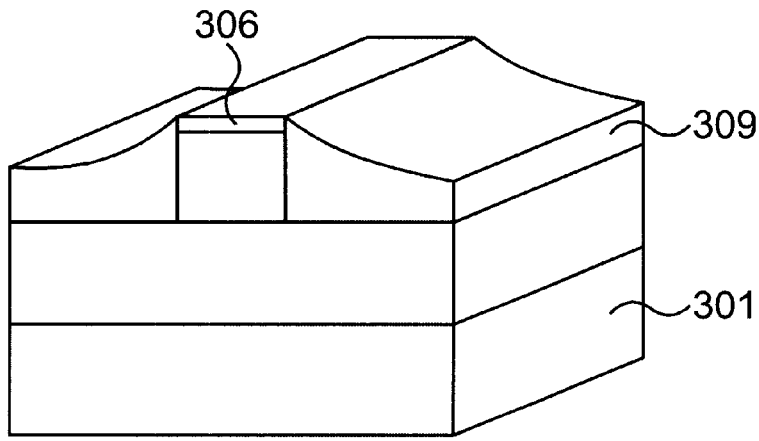
Figure 5C:
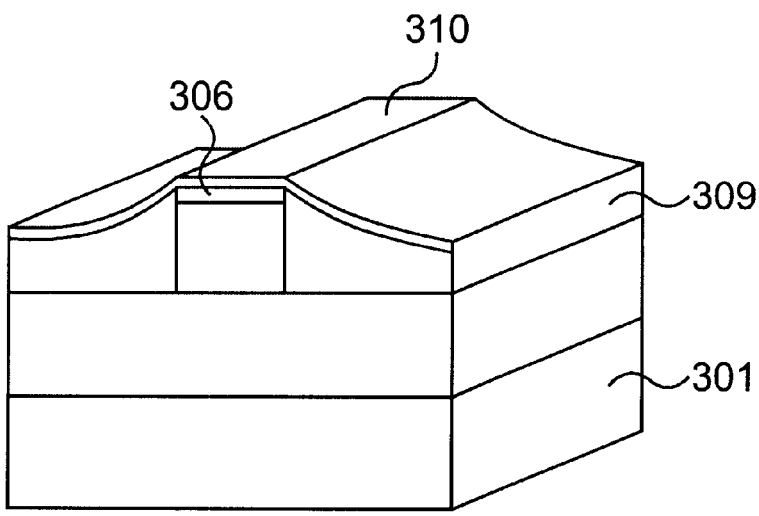

As shown in FIG. 3E, the metals 10, 11 are subjected to AR and HR coating and cleaved in a predetermined shape. As a result, the p-electrode 12 and n-electrode 13 are produced, so that a laterally-coupled distributed feedback semiconductor laser element is formed.

In the production process of the laterally-coupled distributed feedback semiconductor laser element according to the present embodiment, as shown in FIG. 2A, the flattening layer 6 is formed so as to submerge the ridge 5a by using water glass, polyimide, or similar material and then hardened. To intensify the strength of the flattening layer 6, it is permissible to harden water glass polyimide, or a similar material so that the ridge 5a is submerged, and then further form a thin metal film, such as aluminum, thereon.

The flattening layer 6 is strengthened by the thin metal film. Thus, photo-resist 7 having a grating pattern, can be formed precisely when photo-resist is coated on the surface of the flattening layer 6, exposed holographically by the 2-beam interference method, and developed.

As described above, when the thin metal film is provided on the surface of the flattening layer 6, the photo-resist 7, including the grating pattern, is formed on the thin metal film. A process for transferring the grating formed on the thin metal film to the semiconductor portion 5b is performed in a batch mode and is carried out as follows.

In the production process corresponding to FIG. 2C, the grating possessed by the photo-resist 7 is transferred to the thin metal film temporarily by performing dry-etching. The dry-etching is performed again and the grating transferred to the thin metal film is transferred to the filling material and is hardened below the thin metal film. By carrying out further dry-etching, the grating transferred to the hardened filling is transferred to the semiconductor portion 5b in a batch mode.

Although the above embodiment has been described by using the 2-beam interference method, other methods may be used. If the 2-beam interference method is used to form the grating, each girder possessed by the grating can be formed easily and securely in a batch. Thus, the cost of the production apparatus is reduced, thereby reducing the production cost of the distributed feedback semiconductor laser element.

According to the present invention, as described above, after a ridge is formed, a flattening layer is formed on the ridge so as to flatten the surface thereof temporarily. Then a grating is formed on the flattening layer and etching or a similar process is carried out to that configuration so as to transfer the grating to the laser substrate. The flattening layer that remains on the ridge is then removed. With such a structure, each girder possessed by the grating can be formed easily and securely, so that productivity of the distributed feedback semiconductor laser element is increased.

Furthermore, by employing the 2-beam interference in the process of forming the grating on the flattening layer, each girder possessed by the grating can be formed easily and securely in a batch mode, so that the productivity of the distributed feedback semiconductor laser element is increased.

It will be apparent to those skilled in the art that various modifications and variations can be made in the a distributed feedback semiconductor laser element and method for making the same of the present invention without departing from the spirit or scope of the invention. Thus, it is intended that the present invention cover the modifications and variations of this invention provided they come within the scope of the appended claims and their equivalents.

What is claimed is:

1. A method for producing a distributed feedback semiconductor laser element, the method comprising:

forming a laser substrate;

forming a ridge by etching the laser substrate;

forming a flattening layer on the ridge;

forming a grating on the flattening layer;

transferring the grating to the laser substrate on which the ridge is formed;

removing the flattening layer; and forming electrodes.

2. The method for producing the distributed feedback semiconductor laser element according to claim 1, wherein the flattening layer submerges the ridge and is formed on an entire surface of the laser substrate on which the ridge is formed.

3. The method for producing the distributed feedback semiconductor laser element according to claim 1, wherein the grating is formed by 2-beam interference.

4. A method for producing a distributed feedback semiconductor laser element, the method comprising:

forming a laser substrate;

forming a ridge by etching the laser substrate;

forming a flattening layer on the ridge, wherein the flattening layer submerges the ridge and is formed on an entire surface of the laser substrate on which the ridge is formed;

forming a thin metal film on the flattening layer;

forming a grating on the thin metal film;

transferring the grating to the laser substrate on which the ridge is formed;

removing the flattening layer; and forming electrodes.

5. The production method for producing the distributed feedback semiconductor laser element according to claim 4, wherein forming the grating on the flattening layer comprises:

coating a resist layer on the thin metal film;

forming the grating on the resist layer; and transferring the grating formed on the resist layer to the flattening layer.

6. The production method for producing the distributed feedback semiconductor laser element according to claim 5, wherein the grating is formed by 2-beam interference.

7. A method for producing a distributed feedback semiconductor laser element, the method comprising:

forming a laser substrate;

forming a ridge by etching the laser substrate;

forming a flattening layer on the ridge;

forming a grating on the flattening layer;

transferring the grating to the laser substrate on which the ridge is formed;

removing the flattening layer; and forming electrodes, wherein forming the grating on the flattening layer comprises:
coating a resist layer on the flattening layer;
forming the grating on the resist layer; and
transferring the grating formed on the resist layer to the flattening layer.

8. A method for producing a distributed feedback semiconductor laser element, the method comprising
forming a laser substrate;
forming a ridge by etching the laser substrate;
forming a flattening layer on the ridge;
forming a thin metal film on the flattening layer;
forming a grating on the thin metal film;
transferring the grating to the laser substrate on which the ridge is formed;
removing the flattening layer; and
forming electrodes.

9. The production method for producing the distributed feedback semiconductor laser element according to claim 7, wherein the grating is formed by 2-beam interference.

* * * * *